US007786839B2

(12) United States Patent
Soendker et al.

(10) Patent No.: US 7,786,839 B2
(45) Date of Patent: Aug. 31, 2010

(54) PASSIVE ELECTRICAL COMPONENTS WITH INORGANIC DIELECTRIC COATING LAYER

(75) Inventors: Erich H. Soendker, Granada Hills, CA (US); Thomas A. Hertel, Santa Clarita, CA (US); Horacio Saldivar, Canoga Park, CA (US)

(73) Assignee: Pratt & Whitney Rocketdyne, Inc., Canoga Park, CA (US)

( * ) Notice: Subject to any disclaimer, the term of this patent is extended or adjusted under 35 U.S.C. 154(b) by 0 days.

(21) Appl. No.: 12/344,570

(22) Filed: Dec. 28, 2008

(65) Prior Publication Data

US 2010/0164669 A1 Jul. 1, 2010

(51) Int. Cl.
*H01F 5/00* (2006.01)

(52) U.S. Cl. .................................................... 336/200

(58) Field of Classification Search .................. 336/65, 336/83, 200, 205–208, 232; 257/531; 360/123.01
See application file for complete search history.

(56) References Cited

U.S. PATENT DOCUMENTS 4,369,557 A 1/1983 Vandebult
4,439,793 A * 3/1984 Nater ........................ 360/121
4,686,147 A * 8/1987 Matsuyama et al. ......... 428/447
4,701,727 A 10/1987 Wong
5,140,497 A 8/1992 Kato et al.
5,404,118 A 4/1995 Okamura et al.
5,538,941 A 7/1996 Findikoglu et al.
5,777,533 A 7/1998 Kato et al.
6,020,799 A 2/2000 Ishizaki et al.
6,083,766 A 7/2000 Chen
6,097,273 A 8/2000 Frye et al.
6,177,151 B1 1/2001 Chrisey et al.
6,268,225 B1 7/2001 Chen et al.
6,370,033 B1 4/2002 Saegusa et al.
6,377,438 B1 4/2002 Deane et al.
6,424,236 B1 7/2002 Kato
6,462,360 B1 10/2002 Higgins, Jr. et al.
6,702,934 B1 3/2004 DeLeon et al.
6,742,242 B2 * 6/2004 Sasaki ..................... 29/603.15
6,766,764 B1 7/2004 Chrisey et al.
6,784,762 B2 8/2004 Kato
6,797,336 B2 9/2004 Garvey et al.
6,885,325 B2 4/2005 Omelyanchouk et al.
6,954,332 B1 * 10/2005 Hong et al. ............ 360/125.56
7,023,299 B2 4/2006 Shoji
7,064,629 B2 6/2006 Shoji
7,192,530 B2 3/2007 Ryu et al.
7,321,284 B2 1/2008 Chen et al.
7,336,501 B2 2/2008 Tanaka
7,339,798 B2 3/2008 Chakravorty
7,345,334 B2 3/2008 Nowak et al.
7,348,866 B2 3/2008 Shiau et al.
7,351,915 B2 4/2008 Ahn et al.
7,352,060 B2 4/2008 Shimizu et al.
7,352,105 B2 4/2008 Mori et al.
7,354,471 B2 4/2008 Hampden-Smith et al.
7,358,208 B2 4/2008 Ito et al.
7,358,591 B2 4/2008 Horikawa et al.
7,403,370 B2 7/2008 Oi et al.
7,405,484 B2 7/2008 Usui et al.

(Continued)

*Primary Examiner*—Tuyen Nguyen
(74) *Attorney, Agent, or Firm*—Carlson Gaskey & Olds PC

(57) ABSTRACT

A passive electrical component includes an inorganic dielectric coating layer laser applied to a conductor layer.

18 Claims, 18 Drawing Sheets

U.S. PATENT DOCUMENTS 7,411,270 B2 8/2008 Min et al.
7,423,418 B2 9/2008 Higashitani et al.
7,423,594 B2 9/2008 Yanagi et al.
7,436,652 B2 10/2008 Naito
7,436,681 B2 10/2008 Tanaka
7,439,203 B2 10/2008 Ito et al.
7,443,021 B2 10/2008 Nakatani
7,443,245 B2 10/2008 Tsurumaki et al.
7,444,726 B1 11/2008 Devoe et al.
7,446,388 B2 11/2008 Casper et al.
7,449,032 B2 11/2008 Vaisman et al.
7,452,656 B2 11/2008 Luch
7,459,765 B2 12/2008 Terui et al.
2004/0263309 A1 12/2004 Ito et al.
2009/0160592 A1* 6/2009 Hopper et al. ................ 336/83

* cited by examiner

| CAPACITOR NAME | AVG. CAPACITANCE/ BREAKDOWN VOLTAGE | OXIDE LAYER THICKNESS | ALUMINUM CONTACT Thk | TEMP. | SOURCE TO SUBSTRATE DIST. | CHART | OBSERVATIONS |
|---|---|---|---|---|---|---|---|
| $Al_2O_3$070808 |  | 0.7 micron | 5kA | 200°C | 10in. | MEDIUM AREA: Al203<br>THEOR. CAPACITANCE (pF): 882<br>THEOR. BREAKDOWN (V): 770 | SMOOTH AND UNIFORM |

| CAPACITOR NAME | AVG. CAPACITANCE/ BREAKDOWN VOLTAGE | OXIDE LAYER THICKNESS | ALUMINUM CONTACT Thk | TEMP. | SOURCE TO SUBSTRATE DIST. | CHART | OBSERVATIONS |
|---|---|---|---|---|---|---|---|
| $HfO_2$ -070908 |  | 0.7 micron | 5kA | 200°C | 10in. | | SMOOTH AND UNIFORM |

<table>
<tr><th>CAPACITOR NAME</th><th>AVG. CAPACITANCE/ BREAKDOWN VOLTAGE</th><th>OXIDE LAYER THICKNESS</th><th>ALUMINUM CONTACT Thk</th><th>TEMP.</th><th>SOURCE TO SUBSTRATE DIST.</th><th>CHART</th><th>OBSERVATIONS</th></tr>
<tr><td>$Al_{0.66}Hf_{0.33}O_3$ 071408</td><td>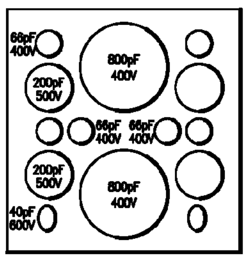
</td><td>0.7 micron</td><td>5kA</td><td>200°C</td><td>10in.</td><td><table><tr><td>LARGE AREA</td><td>Al2O3</td><td>HfO2</td></tr><tr><td>THEOR. CAPACITANCE (pF)</td><td>882</td><td>9766</td></tr><tr><td>THEOR. BREAKDOWN (V)</td><td>770</td><td>595</td></tr></table></td><td>PEELING AROUND EDGES</td></tr>
</table>

FIG.3C

| CAPACITOR NAME | AVG. CAPACITANCE/ BREAKDOWN VOLTAGE | OXIDE LAYER THICKNESS | ALUMINUM CONTACT Thk | TEMP. | SOURCE TO SUBSTRATE DIST. | CHART | OBSERVATIONS |
|---|---|---|---|---|---|---|---|
| $Al_2O_3$080608-1 |  | 3.0 micron | 5kA | 200°C | 10in. | LARGE AREA: Al203<br>THEOR. CAPACITANCE (pF): 865<br>THEOR. BREAKDOWN (V): 3300 | MINOR CRACKS IN OXIDE LAYER |

<table>
<tr><th>CAPACITOR NAME</th><th>AVG. CAPACITANCE/ BREAKDOWN VOLTAGE</th><th>OXIDE LAYER THICKNESS</th><th>ALUMINUM CONTACT Thk</th><th>TEMP.</th><th>SOURCE TO SUBSTRATE DIST.</th><th>CHART</th><th>OBSERVATIONS</th></tr>
<tr><td>$Al_{0.66}Hf_{0.33}O_3$ 080808-1</td><td>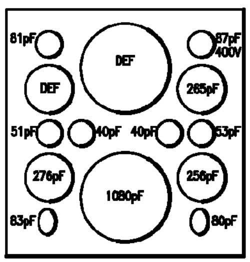
</td><td>2.1 micron</td><td>5kA</td><td>200°C</td><td>10in.</td><td><table>
<tr><td>LARGE AREA</td><td>Al2O3</td><td>HfO2</td></tr>
<tr><td>THEOR. CAPACITANCE (pF)</td><td>1202</td><td>3165</td></tr>
<tr><td>THEOR. BREAKDOWN (V)</td><td>2376</td><td>1836</td></tr>
</table></td><td>SMOOTH AND UNIFORM OXIDE LAYER</td></tr>
</table>

FIG.3E

| CAPACITOR NAME | AVG. CAPACITANCE/ BREAKDOWN VOLTAGE | OXIDE LAYER THICKNESS | ALUMINUM CONTACT Thk | TEMP. | SOURCE TO SUBSTRATE DIST. | CHART | OBSERVATIONS |
|---|---|---|---|---|---|---|---|
| $Al_{0.66}Hf_{0.33}O_3$ 081908-1 |   | 1.8 micron | 5kA | 400 °C | 10in. | LARGE AREA / Al203 / Hf02<br>THEOR. CAPACITANCE (pF) / 1443 / 3798<br>THEOR. BREAKDOWN (V) / 1980 / 1530 | SMOOTH AND UNIFORM OXIDE LAYER |

| CAPACITOR NAME | AVG. CAPACITANCE/ BREAKDOWN VOLTAGE | OXIDE LAYER THICKNESS | ALUMINUM CONTACT Thk | TEMP. | SOURCE TO SUBSTRATE DIST. | CHART | OBSERVATIONS |
|---|---|---|---|---|---|---|---|
| $Al_{0.8}Hf_{0.2}O_3$ 082008-1 |  | 0.9 micron | 5kA | 400°C | 10in. | LARGE AREA: Al203 / Hf02; THEOR. CAPACITANCE (pF): 2886 / 7596; THEOR. BREAKDOWN (V): 990 / 760 | SMOOTH AND UNIFORM OXIDE LAYER |

Chart:

| LARGE AREA | Al203 | Hf02 |
|---|---|---|
| THEOR. CAPACITANCE (pF) | 2886 | 7596 |
| THEOR. BREAKDOWN (V) | 990 | 760 |

<table>
<tr><th>CAPACITOR NAME</th><th>AVG. CAPACITANCE/ BREAKDOWN VOLTAGE</th><th>OXIDE LAYER THICKNESS</th><th>ALUMINUM CONTACT Thk</th><th>TEMP.</th><th>SOURCE TO SUBSTRATE DIST.</th><th>CHART</th><th>OBSERVATIONS</th></tr>
<tr><td>$Al_{0.8}Hf_{0.2}O_3$ 082008-2</td><td>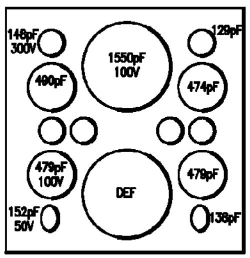
</td><td>0.9 micron</td><td>5kA</td><td>400 °C</td><td>10in.</td><td><table><tr><td>LARGE AREA</td><td>Al203</td><td>Hf02</td></tr><tr><td>THEOR. CAPACITANCE (pF)</td><td>2886</td><td>7596</td></tr><tr><td>THEOR. BREAKDOWN (V)</td><td>990</td><td>765</td></tr></table></td><td>SMOOTH AND UNIFORM OXIDE LAYER</td></tr>
</table>

FIG.3H

| CAPACITOR NAME | AVG. CAPACITANCE/ BREAKDOWN VOLTAGE | OXIDE LAYER THICKNESS | ALUMINUM CONTACT Thk | TEMP. | SOURCE TO SUBSTRATE DIST. | CHART | OBSERVATIONS |
|---|---|---|---|---|---|---|---|
| $Al_{0.66}Hf_{0.33}O_3$ 082208-1 |  | 6.0 micron | 5kA | 400°C | 5in. | LARGE AREA \| Al203 \| Hf02<br>THEOR. CAPACITANCE (pF) \| 432 \| 1139<br>THEOR. BREAKDOWN (V) \| 660 \| 5100 | SMOOTH AND UNIFORM OXIDE LAYER |

<table>
<tr><th>CAPACITOR NAME</th><th>AVG. CAPACITANCE/ BREAKDOWN VOLTAGE</th><th>OXIDE LAYER THICKNESS</th><th>ALUMINUM CONTACT Thk</th><th>TEMP.</th><th>SOURCE TO SUBSTRATE DIST.</th><th>CHART</th><th>OBSERVATIONS</th></tr>
<tr><td>$Al_{0.66}Hf_{0.33}O_3$ 082208-2</td><td>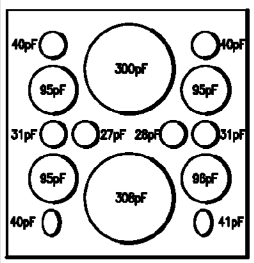
</td><td>6.0 micron</td><td>5kA</td><td>400°C</td><td>5in.</td><td><table><tr><td>LARGE AREA</td><td>Al203</td><td>Hf02</td></tr><tr><td>THEOR. CAPACITANCE (pF)</td><td>432</td><td>1139</td></tr><tr><td>THEOR. BREAKDOWN (V)</td><td>660</td><td>5100</td></tr></table></td><td>SMOOTH AND UNIFORM OXIDE LAYER</td></tr>
</table>

FIG.3J

<table>
<tr><th>CAPACITOR NAME</th><th>AVG. CAPACITANCE/ BREAKDOWN VOLTAGE</th><th>OXIDE LAYER THICKNESS</th><th>ALUMINUM CONTACT Thk</th><th>TEMP.</th><th>SOURCE TO SUBSTRATE DIST.</th><th>CHART</th><th>OBSERVATIONS</th></tr>
<tr><td>$Al_{0.66}Hf_{0.33}O_3$ 082808</td><td>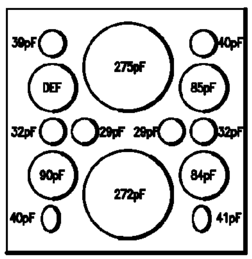
</td><td>6.7 micron</td><td>>5kA</td><td>400°C</td><td>5in.</td><td><table><tr><td>LARGE AREA</td><td>Al203</td><td>Hf02</td></tr><tr><td>THEOR. CAPACITANCE (pF)</td><td>387</td><td>1020</td></tr><tr><td>THEOR. BREAKDOWN (V)</td><td>7370</td><td>5695</td></tr></table></td><td>SMOOTH AND UNIFORM OXIDE LAYER</td></tr>
</table>

FIG.3K

<table>
<tr><th>CAPACITOR NAME</th><th>AVG. CAPACITANCE/ BREAKDOWN VOLTAGE</th><th>OXIDE LAYER THICKNESS</th><th>ALUMINUM CONTACT Thk</th><th>TEMP.</th><th>SOURCE TO SUBSTRATE DIST.</th><th>CHART</th><th>OBSERVATIONS</th></tr>
<tr><td>$Al_{0.66}Hf_{0.33}O_3$ 091908</td><td>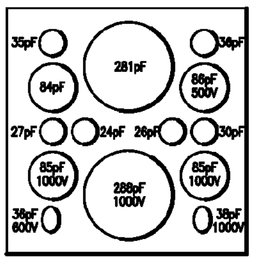
</td><td>~60kA</td><td>>5kA</td><td>550 °C</td><td>5in.</td><td><table><tr><td>LARGE AREA</td><td>Al2O3</td><td>HfO2</td></tr><tr><td>THEOR. CAPACITANCE (pF)</td><td>433</td><td>1139</td></tr><tr><td>THEOR. BREAKDOWN (V)</td><td>6000</td><td>5100</td></tr></table></td><td>DARK DEPOSITION, SMOOTH BUT WITH BIG LONG CRACKS</td></tr>
</table>

FIG. 3L

| CAPACITOR NAME | AVG. CAPACITANCE/ BREAKDOWN VOLTAGE | OXIDE LAYER THICKNESS | ALUMINUM CONTACT Thk | TEMP. | SOURCE TO SUBSTRATE DIST. | CHART | OBSERVATIONS |
|---|---|---|---|---|---|---|---|
| $Al_{0.5}Y_{0.5}O_3$/Al203 092408 |   | Al.5Y.503~40kA Al203~41kA TOTAL: 81kA | >5kA | 550°C | 5in. | LARGE AREA: Al203, Y203; THEOR. CAPACITANCE (pF): 320, 607; THEOR. BREAKDOWN (V): 8100, 6075 | CLEAR DEPOSITION, SMOOTH AND UNIFORM NO CRACKS |

<table>
<tr><th>CAPACITOR NAME</th><th>AVG. CAPACITANCE/ BREAKDOWN VOLTAGE</th><th>OXIDE LAYER THICKNESS</th><th>ALUMINUM CONTACT Thk</th><th>TEMP.</th><th>SOURCE TO SUBSTRATE DIST.</th><th>CHART</th><th>OBSERVATIONS</th></tr>
<tr><td>$Al_{0.5}Y_{0.5}O_3$/Al203<br>092408</td><td>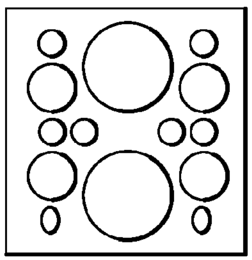</td><td>Al.5Y.503~40kA<br>Al203~40kA<br>TOTAL: ~80kA</td><td>>5kA</td><td>550°C</td><td>5in.</td><td><table><tr><td>LARGE AREA</td><td>Al203</td><td>Y203</td></tr><tr><td>THEOR. CAPACITANCE (pF)</td><td>4000</td><td>7965</td></tr><tr><td>THEOR. BREAKDOWN (V)</td><td>8000</td><td>6000</td></tr></table></td><td>CLEAR DEPOSITION, SMOOTH AND UNIFORM<br>NO CRACKS</td></tr>
</table>

FIG.3N

PASSIVE ELECTRICAL COMPONENTS WITH INORGANIC DIELECTRIC COATING LAYER

BACKGROUND

The present disclosure relates to passive electrical components.

The advent of relatively high temperature semiconductor devices, such as silicon-on-sapphire (SOS) and wide-band gap (WBG) semiconductors, has produced devices which can operate at high temperatures from 200° C. to 300° C. base plate temperatures. In comparison, silicon based devices have maximum base plate temperatures of 85° C. to 125° C.

However, not all passive electrical components used with the high temperature semiconductor devices have been optimized for such high temperatures. Current passive electrical components provide significantly reduced efficiency in a 300° C. environment.

BRIEF DESCRIPTION OF THE DRAWINGS

Various features will become apparent to those skilled in the art from the following detailed description of the disclosed non-limiting embodiment. The drawings that accompany the detailed description can be briefly described as follows.

DETAILED DESCRIPTION

Figure 1:
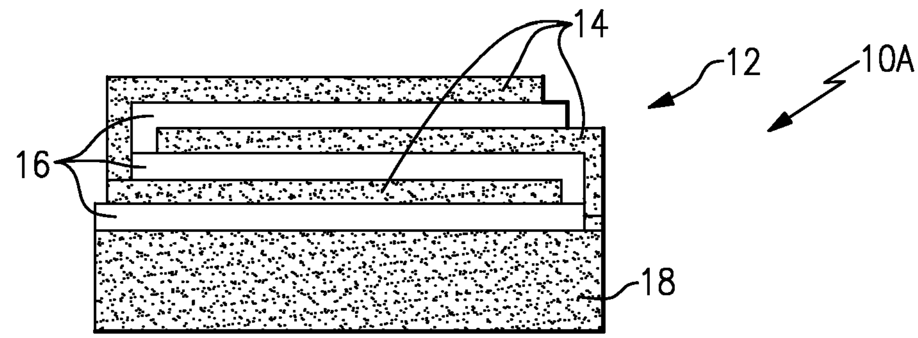
FIG. 1 is a sectional view through a passive electrical component.

FIG. 1 schematically illustrates a passive electrical component 10A which in this disclosed non-limiting embodiment is illustrated as a capacitor 12. The capacitor 12 includes a multiple of conductor layers 14 with an inorganic dielectric coating layer 16 therebetween. When a voltage potential difference occurs between the conductor layers 14, an electric field occurs in the inorganic dielectric coating layer 16 as generally understood. The capacitor 12 may include a multiple of layers, here illustrated with three inorganic dielectric coating layers 16 and alternating connected conductor layers 14.

The capacitor 12 may be formed on a substrate 18. The substrate 18 may be a conductive substrate such as aluminum or a non-conductive substrate deposited with a conductive layer such as silicon carbide (SiC) layered with aluminum. In one non-limiting embodiment, the aluminum may be polished to provide a surface roughness of approximately 20 nm to 85 nm.

The conductor layers 14 may be formed of, for example, aluminum, nickel, copper, gold or other conductive inorganic material or combination of materials. Various aspects of the present disclosure are described with reference to a multiple of inorganic dielectric coating layers 16 and alternating connected conductor layers 14 formed adjacent or on the substrate or upon another layer. As will be appreciated by those of skill in the art, references to a layer formed on or adjacent another layer or substrate contemplates that additional other layers may intervene.

The inorganic dielectric coating layer 16 may be formed of, for example, halfnium oxide, silicone dioxide, silicon nitrides, fused aluminum oxide, $Al_{0.66}Hf_{0.33}O_3$, $Al_{0.8}Hf_{0.2}O_3$, $Al_{0.5}Y_{0.5}O_3$, or other inorganic materials or combination of inorganic materials. In one non-limiting embodiment, the inorganic dielectric coating layer 16 may be deposited to a thickness from approximately 0.6 microns to 10 microns.

The inorganic dielectric coating layer 16 may be applied through a pulsed laser deposition (PLD) process such as that provided by Blue Wave Semiconductors, Inc. of Columbia, Md. USA. The PLD process facilitates multiple combinations of metal-oxides and nitrides on SiC, Si, AlN, Al, Cu, Ni or any other suitable flat surface. A multilayer construction of dielectric stacks, with atomic and coating interface arrangements of crystalline and amorphous films may additionally be provided. The inorganic dielectric coating layer 16 provides a relatively close coefficient of thermal expansion (CTE) match to an SiC substrate so as to resist the thermal cycling typical of high temperature operations. The PLD process facilitates a robust coating and the engineered material allows, in one non-limiting embodiment, 3 microns of the inorganic dielectric coating layer 16 to store approximately 1000V.

The PLD process facilitates deposition of the inorganic dielectric coating layer 16 that can provide a flat dielectric constant at approximately 300° C. and the ability to place the inorganic dielectric coating layer 16 in various spaces so as to minimize wasted space. It should be understood that the PLD process facilitates deposition of the inorganic dielectric coating layer 16 on various surfaces inclusive of flat and curves surfaces.

Some factors which may affect the quality of the capacitor include the substrate surface smoothness, the smoothness of the oxide layer, and the thickness and surface area of the inorganic dielectric coating layer 16. A relatively thicker inorganic dielectric coating layer 16 provides a higher breakdown voltage but may facilitate cracks. A relatively larger electrode surface area tends to have more defects and therefore decrease breakdown voltage while a relatively smaller surface area tends to have a higher capacitor density and a higher breakdown voltage.

During development of the passive electrical component of the present disclosure, various material test coupons were evaluated. The operational capabilities of the capacitor are further defined from the following examples.

Figure 2A:
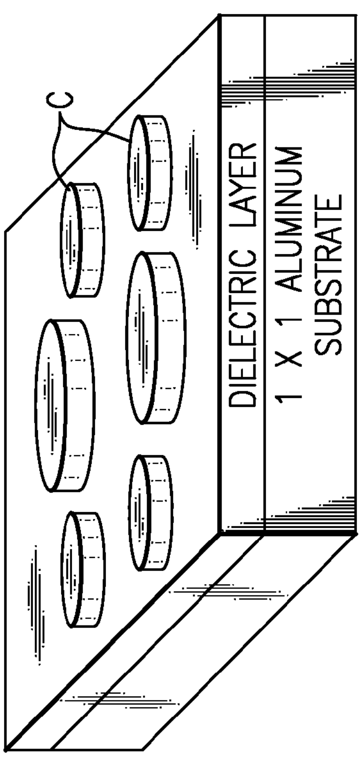
FIG. 2A schematically illustrates a coupon testing proof of concept having a multiple of capacitor areas.
Figure 2B:
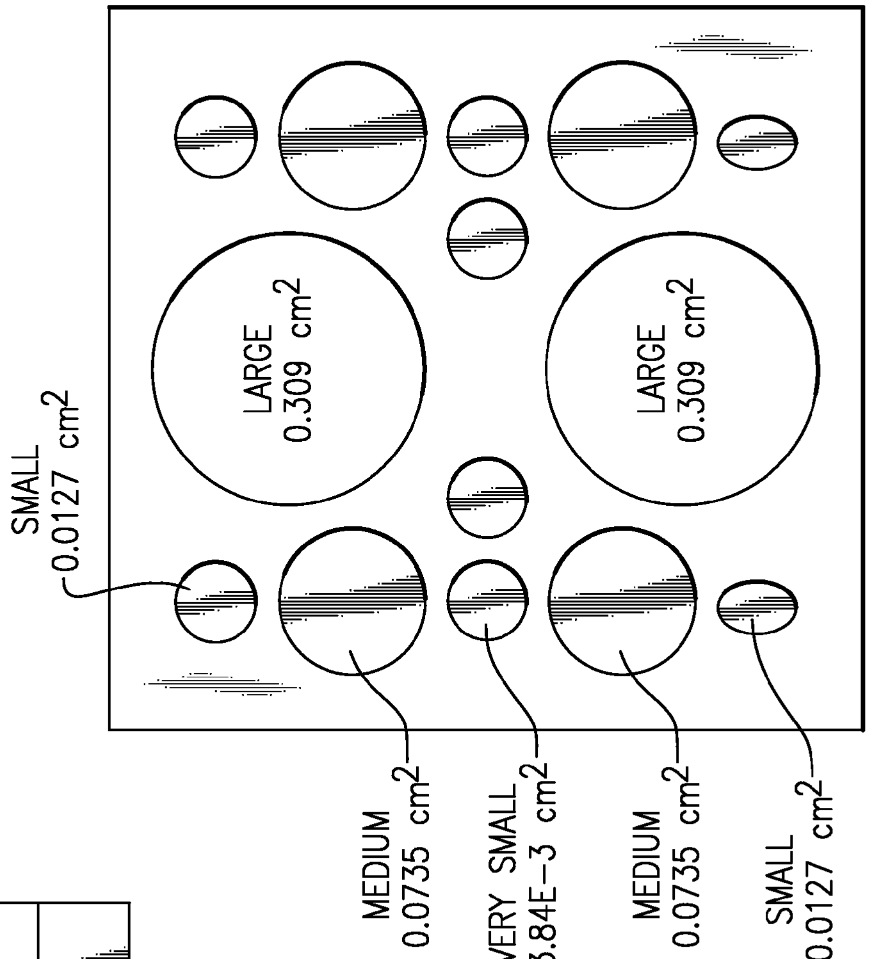
FIG. 2B illustrates the scale of the capacitor area.
Figure 3A:
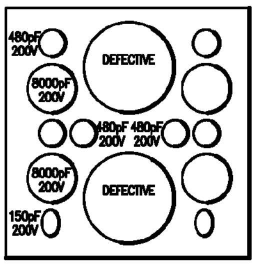
FIGS. 3A-3N illustrate particular coupons with an Average Capacitance/Breakdown Voltage for each capacitor area C on the coupon.
Figure 3B:
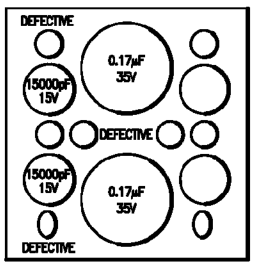
Figure 3D:
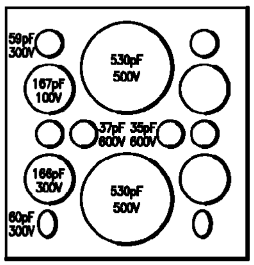
Figure 3F:
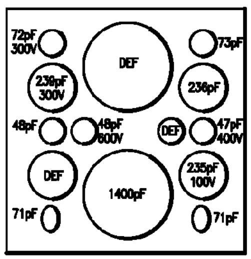
Figure 3G:
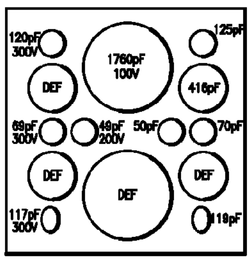
Figure 3I:
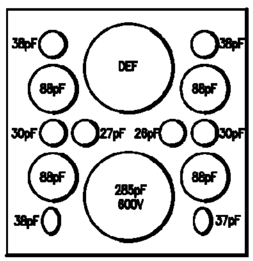
Figure 3M:
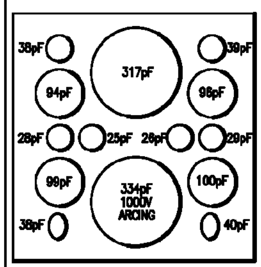
Figure 4:
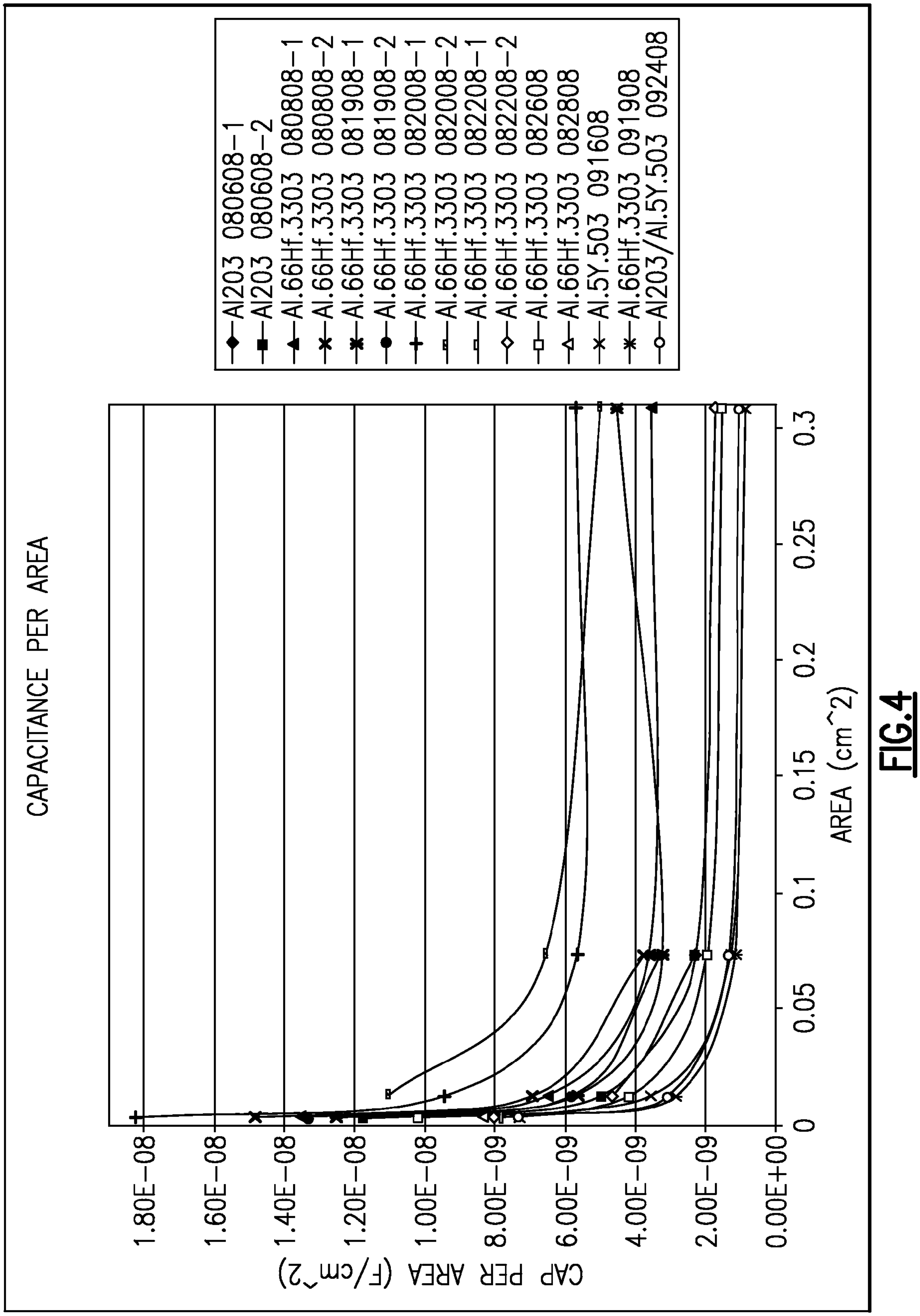
FIG. 4 is a graph which defines a capacitance per area based in part on the material combination of a inorganic dielectric coating layer.

Referring to FIG. 2A, coupon testing proof of concept has show that the size of the capacitor 12 compared to current state-of-the art technology results in an approximately twenty times reduction in size and mass for the same voltage rating. Each coupon includes a multiple of capacitor areas C (FIG. 2B) with top contacts manufactured of aluminum for evaluation. FIGS. 3A-3N illustrates particular coupons with an average capacitance/breakdown voltage for each capacitor area C on the coupon. The test results provide a capacitance per area based in part on the material combination of the inorganic dielectric coating layer 16 (FIG. 4).

Figure 5:
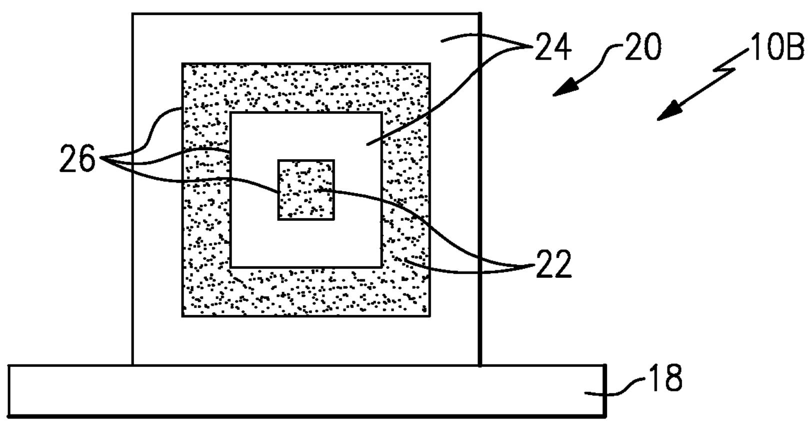
FIG. 5 is a sectional view through another passive electrical component.
Figure 6:
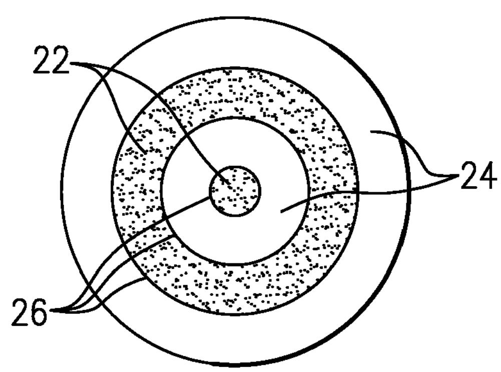
FIG. 6 is a sectional view through another passive electrical component.

Referring to FIG. 5, another passive electrical component 10B is illustrated as an inductor 20. Capacitors are to electric fields what inductors are to magnetic fields. The inductor 20 includes a multiple of conductor layers 22, a multiple of high permeability layers 24 and an inorganic dielectric coating layer 26 between each conductor layer 22 and high permeability layer 24. The inductor 20 may include a multiple of layers, here illustrated with two conductor layers 22 and two high permeability layers 24. The multiple of conductor layers 22 and high permeability layers 24 may be built up upon the substrate 18 as a series of layers. The inductor 20 may be rectilinear in cross-section or of other cross-sectional shapes such as round (FIG. 6) which are built up about a wire or other solid.

The inductor 20 may be formed on a substrate 18. The substrate 18 may be a conductive substrate such as aluminum or a non-conductive substrate deposited with a conductive layer such as silicon carbide (SiC) layered with aluminum or other material.

The conductor layers 22 may be formed of, for example, aluminum, nickel, copper, gold or other conductive inorganic material or combination of materials.

The high permeability layers 24 may be manufactured of a permalloy material which is typically a nickel iron magnetic alloy. The permalloy material, in one non-limiting embodiment, includes an alloy with about 20% iron and 80% nickel content. The high permeability layer 24 has a relatively high magnetic permeability, low coercivity, near zero magnetostriction, and significant anisotropic magnetoresistance.

The inorganic dielectric coating layer 26 may be formed by the PLD process as previously described to separate the current flow through each conductor layer 22 and each high permeability layers 24 which travel in opposite directions.

System benefits of the high temperature passive electrical components disclosed herein include reduced weight and robust designs. The combination of high temperature electronic devices with high temperature passive electrical components provide effective operations in temperatures of up to 300° C. with relatively smaller, lighter heat sinks and/or the elimination of active cooling systems.

Although an inductor and capacitor are disclosed as passive electrical components, it should be understood that other passive electrical components such as resistors, strain gauges and others may be manufactured as disclosed herein. The inductor and capacitor may be deposited on the same substrate in various combinations to form power dense filters for power applications and general extreme environment electronic systems.

Figure 7:
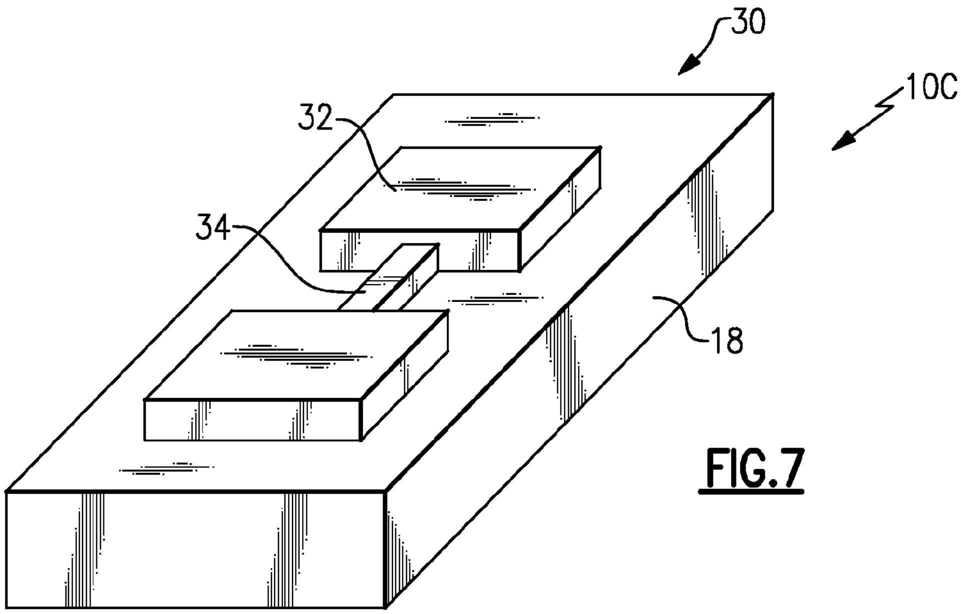
FIG. 7 is a sectional view through another passive electrical component.

Referring to FIG. 7, another passive electrical component 10C is illustrated as a resistor 30 formed on a substrate 18. The substrate 18 may be manufactured of a non-conductive material such as Alumina or a conductive material with a non-conductive layer formed by the PLD process as previously described. Each conductive contact 32 and a resistive element 34 may also be formed by the PLD process. In one non-limiting embodiment, the resistor element 34 may include a mix of dielectric and conductive particles within an inorganic material of a resistive nature.

Figure 8:
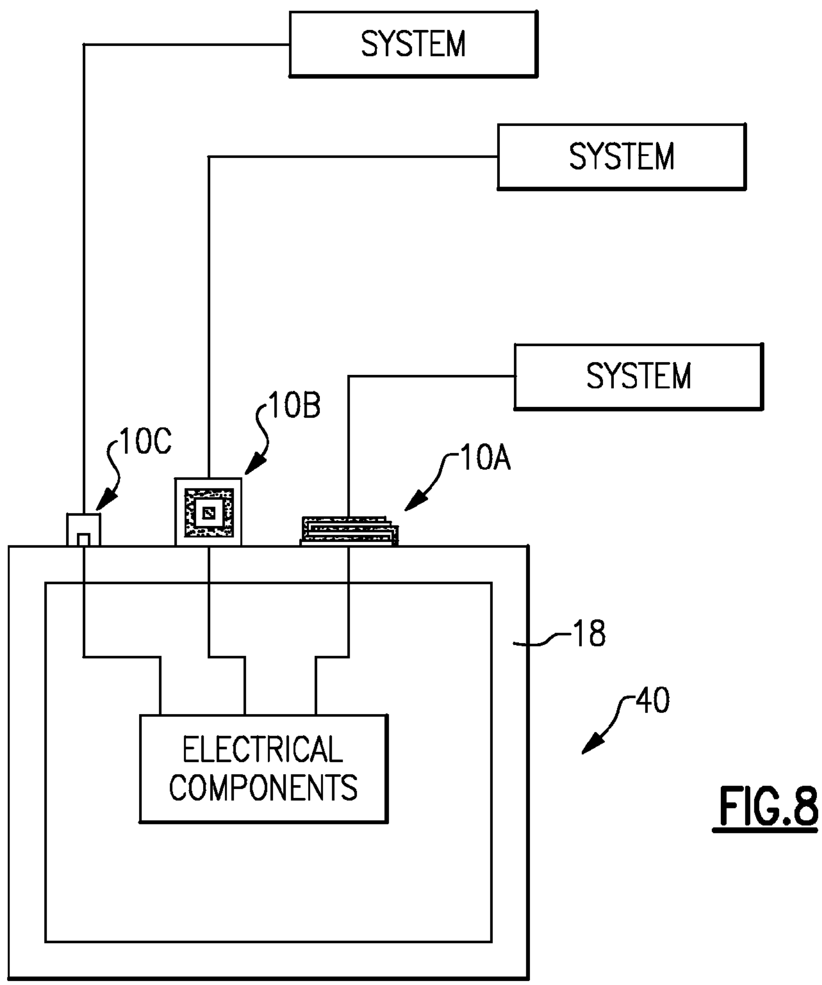
FIG. 8 is a schematic view of a passive electrical component mounted to a substrate which is a case for other electronic components.

Referring to FIG. 8, passive electrical components 10 may be deposited directly upon a substrate which defines a module 40 for other electrical components. The other electrical components may be mounted within the module 40 in electrical communication with the passive electrical components 10 so as to provide a compact system such as the aforementioned portable/emergency power generators and aerospace power units. It should be understood that the passive electrical components 10 may alternatively be deposited on other substrates which provide other mechanical or electrical functionality.

It should be understood that like reference numerals identify corresponding or similar elements throughout the several drawings. It should also be understood that although a particular component arrangement is disclosed in the illustrated embodiment, other arrangements will benefit herefrom.

The foregoing description is exemplary rather than defined by the limitations within. Various non-limiting embodiments are disclosed herein, however, one of ordinary skill in the art would recognize that various modifications and variations in light of the above teachings will fall within the scope of the appended claims.

What is claimed is:

1. A component comprising:

a substrate;

a first conductor layer in contact with said substrate;

a second conductor layer in contact with said substrate; and an inorganic coating layer laser applied to said substrate to provide a passive electrical component between the first and second conductor layers, wherein said inorganic coating layer includes a dielectric particle and a conductive particle.

2. The component as recited in claim 1, wherein said inorganic coating layer has a thickness between approximately 0.6 microns to 10 microns.

3. The component as recited in claim 1, wherein said inorganic dielectric coating layer is selected from: halfnium oxide, silicone dioxide, silicon nitrides, fused aluminum oxide, $Al_{0.66}Hf_{0.33}O_3$, $Al_{0.8}Hf_{0.2}O_3$, and $Al_{0.5}Y_{0.5}O_3$.

4. The component as recited in claim 1, wherein said inorganic coating layer is between said conductor layer and a high permeability layer.

5. A capacitor comprising:

a substrate;

a plurality of conductor layers, at least one conductor layer in contact with said substrate; and an inorganic coating layer between each two of said plurality of conductor layers, each of said inorganic coating layer having a thickness between approximately 0.6 microns to 10 microns to provide a capacitor upon said substrate, wherein said inorganic coating layer includes a dielectric particle and a conductive particle.

6. The capacitor as recited in claim 5, wherein said inorganic coating layer is selected from: halfnium oxide, silicone dioxide, silicon nitrides, fused aluminum oxide, $Al_{0.66}Hf_{0.33}O_3$, $Al_{0.8}Hf_{0.2}O_3$, and $Al_{0.5}Y_{0.5}O_3$.

7. The capacitor as recited in claim 5, wherein said substrate is conductive.

8. The capacitor as recited in claim 5, wherein said substrate is non-conductive with a conductive layer deposited thereon.

9. The capacitor as recited in claim 5, wherein a portion of a module forms said substrate.

10. The capacitor as recited in claim 9, wherein said module is manufactured of aluminum.

11. An inductor comprising:

a substrate;

a plurality of conductor layers;

a plurality of high permeability layers, at least one of said plurality of high permeability layers adjacent to said substrate; and an inorganic coating layer between each of said plurality of conductor layers and each of said plurality of high permeability layers to provide an inductor upon said substrate, wherein said inorganic coating layer includes a dielectric particle and a conductive particle.

12. The inductor as recited in claim 11, wherein said inorganic coating layer is selected from: halfnium oxide, silicone dioxide, silicon nitrides, fused aluminum oxide, $Al_{0.66}Hf_{0.33}O_3$, $Al_{0.8}Hf_{0.2}O_3$, and $Al_{0.5}Y_{0.5}O_3$.

13. The inductor as recited in claim 11, wherein said substrate is conductive.

14. The inductor as recited in claim 11, wherein said substrate is a non-conductive substrate with a conductive layer deposited thereon.

15. The inductor as recited in claim 11, wherein a portion of a module forms said substrate.

16. The component as recited in claim 1, wherein said substrate is a conductive substrate.

17. The component as recited in claim 1, wherein said substrate is a non-conductive substrate.

18. The component as recited in claim 1, wherein said conductor layer is selected from: aluminum, nickel, copper or gold.

* * * * *